United States Patent
Wright et al.

(10) Patent No.: US 11,008,649 B2
(45) Date of Patent: May 18, 2021

(54) ADVANCED SPUTTER TARGETS FOR ION GENERATION

(71) Applicant: APPLIED Materials, Inc., Santa Clara, CA (US)

(72) Inventors: Graham Wright, Newburyport, MA (US); Klaus Becker, Kensington, NH (US)

(73) Assignee: Applied Materials, Inc., Santa Clara, CA (US)

(*) Notice: Subject to any disclaimer, the term of this patent is extended or adjusted under 35 U.S.C. 154(b) by 356 days.

(21) Appl. No.: 16/191,526

(22) Filed: Nov. 15, 2018

(65) Prior Publication Data
US 2020/0157675 A1    May 21, 2020

(51) Int. Cl.
*H01J 37/34* (2006.01)
*C23C 14/34* (2006.01)

(52) U.S. Cl.
CPC ...... *C23C 14/3414* (2013.01); *C23C 14/3428* (2013.01); *H01J 37/3426* (2013.01); *H01J 37/3429* (2013.01); *H01J 37/3435* (2013.01)

(58) Field of Classification Search
None
See application file for complete search history.

(56) References Cited

U.S. PATENT DOCUMENTS

2016/0209124 A1* 7/2016 Da Silvaa ............... F28D 7/082

OTHER PUBLICATIONS

Jaworski et al., "Observations of Liquid Lithium Uptake in a Porous Molybdenum Foam", Journal of Nuclear Materials, vol. 378, pp. 105-109, 2008.

* cited by examiner

*Primary Examiner* — Jason Berman
(74) *Attorney, Agent, or Firm* — Nields, Lemack & Frame, LLC (57) ABSTRACT

An advanced sputter target is disclosed. The advanced sputter target comprises two components, a porous carrier, and a metal material disposed within that porous carrier. The porous carrier is designed to be a high porosity, open cell structure such that molten material may flow through the carrier. The porous carrier also provides structural support for the metal material. The cell sizes of the porous carrier are dimensioned such that the capillary action and surface tension prohibits the metal material from spilling, dripping, or otherwise exiting the porous carrier. In some embodiments, the porous carrier is an open cell foam, a weave of strands or stacked meshes.

9 Claims, 9 Drawing Sheets

ADVANCED SPUTTER TARGETS FOR ION GENERATION

FIELD

Embodiments of the present disclosure relate to an advanced sputter target, and more particularly, a porous carrier holding a metal material that may be used as a sputter target.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. In some embodiments, a magnetic field is used to further confine the electrons within the arc chamber.

In certain embodiments, electrodes are also disposed on one or more side walls of the arc chamber. These electrodes may be positively or negatively biased so as to control the position of ions and electrons, so as to increase the ion density near the center of the arc chamber. An extraction aperture is disposed along another side, proximate the center of the arc chamber, through which the ions may be extracted.

In certain embodiments, it may be desirable to utilize a feed material that is in solid form as a dopant species. For example, the solid feed material may serve as a sputter target. Ions strike the solid feed material, emitting neutrals of the feed material, which can then be ionized and energized in a plasma and used for deposition or implantation. However, there are issues associated with using solid feed materials. For example, in the high-temperature environment of an IHC ion source, metal sputter targets are prone to melting, dripping, and generally degrading and destroying the arc chamber as liquid metal runs and pools in the arc chamber. As a result, ceramics that contain the dopant of interest are commonly used as the solid dopant material, because they have higher melt temperatures. However, these ceramic materials typically generate less beam current of the dopant of interest. If the metal sputter target could maintain its shape without dripping or deformation upon melting, significant increases in dopant beam current could be realized.

Therefore, an advanced sputter target that may be used within an ion source without these limitations would be beneficial. Further, it would be advantageous if the ion source was not contaminated by the advanced sputter target.

SUMMARY

An advanced sputter target is disclosed. The advanced sputter target comprises two components, a porous carrier, and a metal material disposed within that porous carrier. The porous carrier is designed to be a high porosity, open cell structure such that molten material may flow through the carrier. The porous carrier also provides structural support for the metal material. The cell sizes of the porous carrier are dimensioned such that the capillary action and surface tension prohibits the metal material from spilling, dripping, or otherwise exiting the porous carrier. In some embodiments, the porous carrier is an open cell foam, a weave of strands or stacked meshes.

According to one embodiment, a sputter target is disclosed. The sputter target comprises a porous carrier having a plurality of open cells; and a metal material disposed in the porous carrier; wherein dimensions of the plurality of open cells and cell openings in the porous carrier are such that a surface tension of the metal material when in molten form is sufficient to retain the metal material in the porous carrier against gravity and electromagnetic forces. In certain embodiments, the metal material comprises a metal having a melting point less than 1200° C. In certain embodiments, the metal material comprises aluminum, indium, gallium or lanthanum. In some embodiments, the porosity of the porous carrier is greater than 50%. In certain embodiment, the porosity is greater than 90%. In certain embodiments, the porous carrier comprises an open cell foam. In some embodiments, the open cell foam comprises graphite, silicon carbide, silicon oxide, alumina, or a refractory metal. In certain embodiments, the porous carrier comprises a weave of strands, where the strands may be a refractory metal. In certain embodiments, the porous carrier comprises stacked meshes, which may comprise a refractory metal.

According to another embodiment, an ion source for generating an ion beam comprising a metal material is disclosed. The ion source comprises an arc chamber having a first end, an opposite second end and walls connecting the first end and the second end, wherein one of the walls comprises an extraction aperture; a cathode disposed at the first end; and a sputter target disposed within the arc chamber, the sputter target comprising a porous carrier, and a metal material disposed within the porous carrier. In certain embodiments, the sputter target is disposed against the second end. In certain embodiments, the sputter target functions as a repeller. In some embodiments, the sputter target is disposed against one of the walls. In certain embodiments, the sputter target serves as a liner and is disposed against at least one of the walls. In some embodiments, the sputter target is retained by a target holder. In certain embodiments, the porous carrier comprises an open cell foam, a weave of strands or stacked meshes.

According to another embodiment, a physical vapor deposition apparatus is disclosed. The physical vapor deposition apparatus comprises a physical vapor deposition (PVD) chamber; a cathode disposed in the PVD chamber, wherein the cathode is biased using a cathode power supply; and a sputter target disposed within the PVD chamber, the sputter target comprising a porous carrier, and a metal material disposed within the porous carrier, and in communication with the cathode power supply. In certain embodiments, the porous carrier comprises an open cell foam, a weave of strands or stacked meshes.

BRIEF DESCRIPTION OF THE FIGURES

For a better understanding of the present disclosure, reference is made to the accompanying drawings, which are incorporated herein by reference and in which.

DETAILED DESCRIPTION

As described above, metal sputter targets may be problematic if the temperature within the arc chamber or other processing chamber exceeds the melting point of the metal. In such instances, the metal sputter target may become molten and drip into the arc chamber, potentially causing damage and reducing the life of the arc chamber.

One approach to address this is to utilize a sputter target that comprises two components; a metal material and a porous carrier to retain the metal material. The metal material may be any metal that has a melting point lower than the temperature achieved within the ion source. For example, the metal material may be any metal or alloy that has a melting point less than 1200° C. Suitable metals, such as aluminum, indium, gallium and lanthanum, may be employed. The porous carrier may be a high porosity, open cell structure, where "porosity" is defined as the percentage of open volume in the porous carrier as compared to the volume of the outer dimensions of the porous carrier, and "high porosity" is defined as greater than 50% in the present disclosure. In certain embodiments, the porous carrier may have a porosity greater than 80%. In yet other embodiments, the porous carrier may have a porosity greater than 90%. In certain embodiments, the porous carrier may have a porosity of over 95%. The term "open cell" is used to refer to any structure that has an accessible open volume throughout. The open cell structure insures that all of the voids within the porous carrier may be accessed and filled by the metal material and avoids the issue of having trapped pockets of atmosphere in the porous carrier.

In addition to having high porosity to allow the introduction of a large amount of metal material, the porous carrier has other properties as well. For example, the porous carrier may be constructed of a material having a higher melting point than the metal material that is being retained. In this way, the porous carrier retains its shape in the ion source. In certain embodiments, it may be desirable that the porous carrier has an etch rate that is comparable to the etch rate of the metal material that is being retained. In this way, the porous carrier is etched away at the same rate as the metal material. In embodiments where the metal material is vaporized, the etch rate of the porous carrier may not be of interest.

In certain embodiments, the cell size is such that the surface tension of the metal material (when in the molten state) prevents the metal material from dripping or spilling out of the porous carrier. In certain embodiments, the combination of surface tension and capillary force retains the metal material within the porous carrier. In other words, the combination of surface tension and capillary force are greater than the external forces acting on the metal material. These external forces include gravity and electromagnetic forces.

Specifically, assume that the force of gravity acts to cause the molten metal to spill out of the porous carrier. Counteracting the force of gravity is the surface tension of the molten metal. Therefore, the molten metal will remain within the porous carrier if the surface tension at the cell opening exceeds the force of gravity exerted on the contents of the cell volume. The cell opening may be defined as the cross-sectional area of the exposed cell that is on the outer surface of the porous carrier. The cell opening may also be defined as the cross-sectional area between adjacent cells in the porous carrier.

Stated differently, $$V_{cell} \times \rho \times g < \gamma \times L_{pore},$$

where $V_{cell}$ is the volume of one of the open cells in the porous carrier;

$\rho$ is the mass density of the molten metal;

g is acceleration due to gravity;

$\gamma$ is the surface tension of the molten metal; and $L_{pore}$ is the perimeter or circumference of the cell opening.

As an example, for molten aluminum, the mass density is about 2375 kg/m$^3$ and the surface tension is about 1.07 N/m. Thus, if the ratio of the volume of an open cell to the perimeter of the cell opening ($V_{cell}/L_{pore}$) is less than $4.5972 \times 10^{-5}$ m$^2$, the molten aluminum will not drip from the cell opening.

Assuming that the cells are spherical and the pores are circular, it may be assumed that the ratio of the volume of an open cell to the perimeter of a cell opening is given by:

$$4/3 \times \Pi \times r^3 / 2 \times \Pi \times r, \text{ or } 2/3 \times r^2$$

Thus, if $2/3\ r^2$ is less than $4.5972 \times 10^{-5}$ m$^2$, the molten aluminum will remain in the porous carrier. The porous carrier having open cells and cell openings with a radius of less than 8.3 mm satisfies this equation.

Similar calculations can be performed for other metals of interest, such as gallium, indium and lanthanum, to determine the appropriate dimensions for the porous carrier.

Thus, in some embodiments, the present disclosure describes a sputter target having a metal material and a porous carrier, wherein the dimensions of the open cells and cell openings of the porous carrier are such that capillary action and the surface tension of the molten metal material is sufficient to retain the molten metal material within the porous carrier against external forces, such as the force of gravity and other electrostatic forces. In certain embodiments, where the forces of gravity and surface tension are dominant, the present disclosure describes a sputter target having a metal material and a porous carrier, wherein the dimensions of the open cells and cell openings of the porous carrier are defined according to the inequality noted above.

It is understood that each metal material of interest has a certain surface tension and mass density. Further, each metal material may be heated to a different temperature. Therefore, in certain embodiments, the porous carrier may be designed for a specific metal material operating in a specific temperature range. In another embodiment, the cell size and open cell volume of the porous carrier may be such that a single porous carrier may be used with all of the metal materials of interest.

Figure 1:
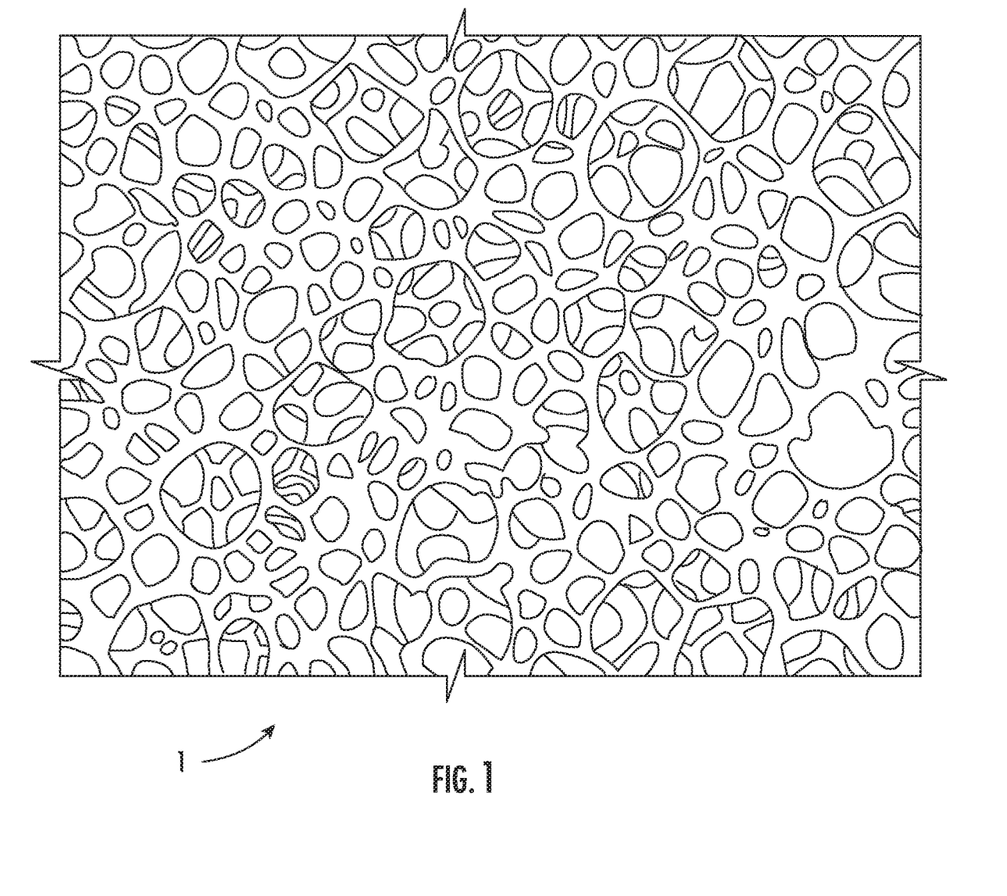
FIG. 1 shows the porous carrier according to one embodiment.

The porous carrier may be constructed in a plurality of ways. FIG. 1 shows a first embodiment of the porous carrier 1. This porous carrier 1 is a high porosity open cell foam structure. The porous carrier 1 may be constructed from graphite. In certain embodiments, the graphite is coated with tungsten to improve its strength. In other embodiments, the porous carrier 1 may be constructed from a refractory metal, such as tungsten, molybdenum or tantalum. In other embodiments, the porous carrier 1 may be constructed from an oxide, such as alumina ($Al_2O_3$) or silicon oxide ($SiO_2$); a nitride, such as silicon nitride; a halide, in particular a metal halide such as aluminum(III) fluoride; a carbide, such as tungsten carbide or silicon carbide (SiC); or alloys such as tantalum/tungsten.

The cell size of the porous carrier 1 and the tendril thickness may be adjusted to optimize capillary force, wicking characteristics, and structural integrity. These parameters may also be adjusted to optimize porosity and surface tension. For example, in certain embodiments, the open cell foam may achieve a porosity of between 93-97%.

Figure 2:
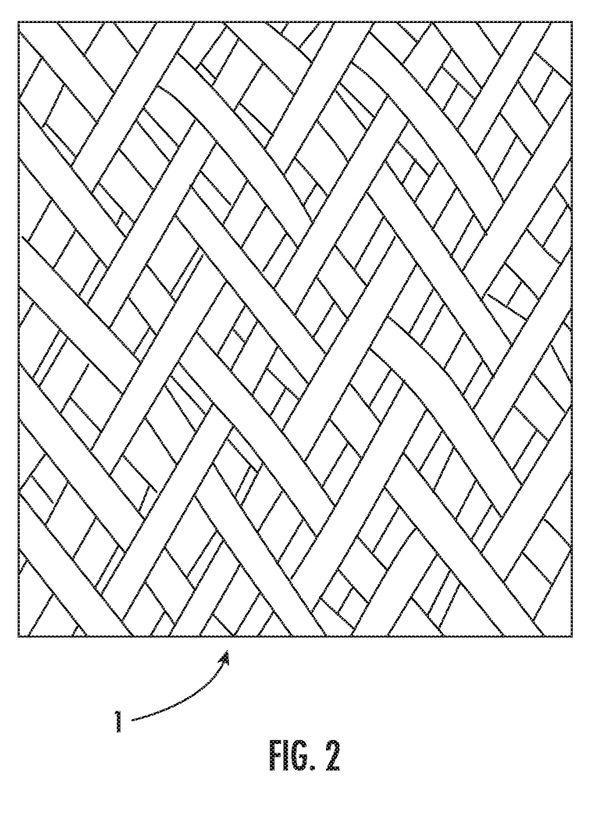
FIG. 2 shows the porous carrier according to a second embodiment.

FIG. 2 shows a second embodiment of a porous carrier 1. In this embodiment, the porous carrier 1 comprises a weave of strands. These strands may be constructed from molybdenum or another refractory metal. In this embodiment, the cell volume may be defined as the surface area of the opening between adjacent strands, multiplied by the distance between the adjacent layers. In certain embodiments, the weave may be wound in a cylinder, where the distance between adjacent layers is defined in the radial direction. The strand spacing and diameter may be such that a cell volume to cell opening ratio is created that allows surface tension and capillary force to overcome any external forces such as gravity or electromagnetic forces acting on the contents of the cell.

Figure 3A:
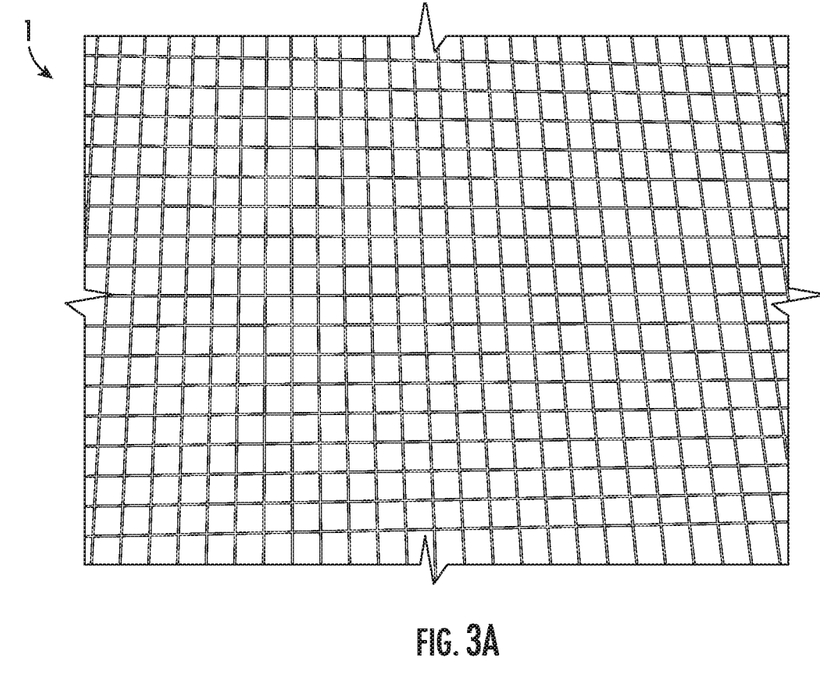
FIG. 3A-3B show the porous carrier according to a third embodiment.
Figure 3B:
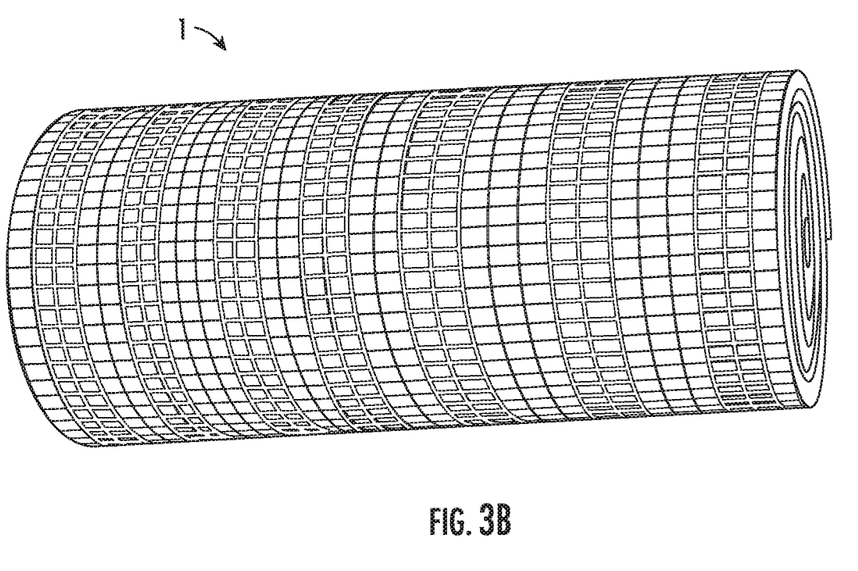

FIGS. 3A-3B shows a third embodiment of a porous carrier 1. In this embodiment, the porous carrier 1 comprises stacked meshes. One such mesh is shown in FIG. 3A. These meshes may be constructed from molybdenum or another refractory metal. In this embodiment, the cell volume may be defined as the surface area of the mesh opening, multiplied by the distance between adjacent mesh layers. In certain embodiments, the mesh may be wound in a cylinder, as shown in FIG. 3B. In this embodiment, the distance between adjacent mesh layers is defined in the radial direction. The strand spacing and diameter may be such that a cell volume to cell opening ratio is created that allows surface tension and capillary force to overcome any external forces such as gravity or electromagnetic forces acting on the contents of the cell.

In each of these embodiments, the metal material may be introduced into the open volume in the porous carrier. According to one process, shown in FIG. 4, one or more surfaces of the porous carrier 1 is subjected to vacuum 6, in order to extract any air from the open volume. At least one surface 4 of the porous carrier 1 may be exposed to molten metal material 5, while one or more of the other surfaces of the porous carrier 1 may be subjected to vacuum 6. In this way, the pressure differential between the molten metal material 5 and the open volume may draw the molten metal material 5 into the porous carrier 1. In certain embodiments, the one surface 4 may be a top surface, so that gravity also assists in drawing the molten metal material 5 into the porous carrier 1.

Figure 4:
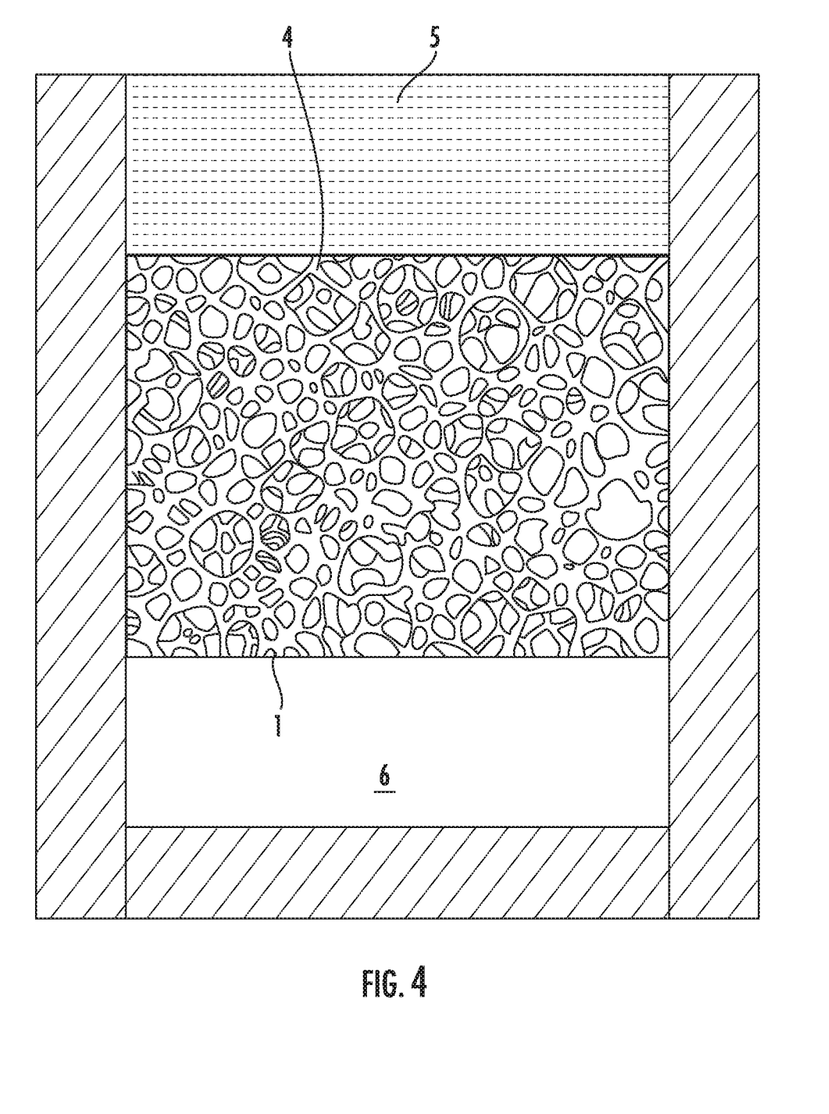
FIG. 4 shows the process of introducing the metal into the porous carrier.

Once the molten metal material 5 has permeated the entirety of the porous carrier 1, the molten metal material 5 and the porous carrier 1 can be cooled so that the metal material hardens within the porous carrier 1 and forms the sputter target. At this point, the sputter target can be machined, if desired, to achieve a desired shape.

Thus, the composition of the sputter target may be such that more than 90% of the total volume comprises the metal material, while the remainder is comprised of the porous carrier. Furthermore, the sputter target maintains its shape whether the metal material is in the solid state or the liquid state. Additionally, the shape of the sputter target is not limited by this disclosure. It may be a cube, a rectangular prism, a sphere, or any other desired shape.

Figure 5:
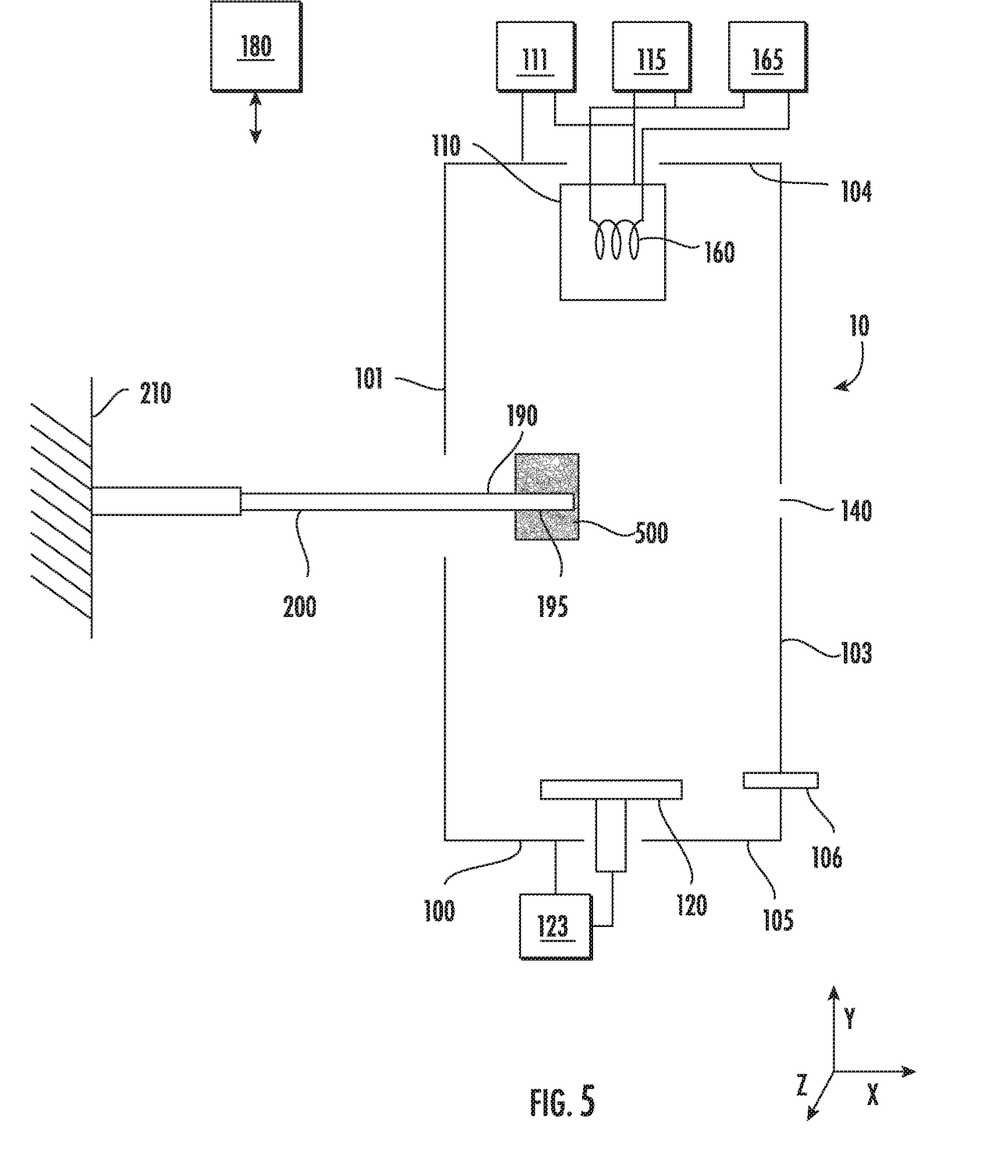
FIG. 5 is an indirectly heated cathode (IHC) ion source that may utilize the sputter target according to one embodiment.

The sputter target may be used in a plurality of environments. FIG. 5 shows an IHC ion source 10 according to a first embodiment that may be used with the sputter target.

The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. The liner may cover an entirety of one or more of the walls 101, such that the one or more walls 101 are not subjected to the harsh environment within the arc chamber 100. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page). Further, the IHC ion source 10 also comprises a gas inlet 106 through which a source gas to be ionized may be introduced to the arc chamber 100.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

In certain embodiments, the IHC ion source 10 also includes a target holder 190, which, in certain embodiments, can be inserted into and retracted from the arc chamber 100. In other embodiments, the target holder 190 may be stationary. In the embodiment of FIG. 5, the target holder 190 enters the arc chamber 100 along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 5, the target holder 190 enters the arc chamber 100 through the side opposite the extraction aperture 140. However, in other embodiments, the target holder 190 may enter through the sides that are adjacent to the extraction plate 103.

The target holder 190 may include a platform on which the sputter target 500 is disposed. In other embodiments, the target holder 190 may include a split ring clamp 195 to hold the sputter target 500.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of source gas that are fed into the arc chamber 100 through the gas inlet 106. The source gas may be a carrier gas, such as argon, or an etching gas, such as fluorine. The combination of electrons from the cathode 110, the source gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching or sputtering by the plasma transforms the metal material into the gas phase and causes ionization. The ionized metal material can then be extracted through the extraction aperture 140 and used to prepare an ion beam.

Negative ions and neutral atoms that are sputtered or otherwise released from the sputter target 500 are attracted toward the plasma, since the plasma is maintained at a more positive voltage than the target holder 190.

In certain embodiments, the metal material in the sputter target 500 is heated and vaporized due to the heat created by the plasma. In other embodiments, the metal material is heated to a temperature beyond its melting point. However, due to the properties of the porous carrier, the molten metal material is retained in the sputter target.

In certain embodiments, the target holder 190 may be made of a conductive material and may be grounded. In a different embodiment, the target holder 190 may be made of a conductive material and may be electrically floated. In a different embodiment, the target holder 190 may be made of a conductive material and may be maintained at the same voltage as the walls 101. In other embodiments, the target holder 190 may be made of an insulating material.

In yet another embodiment, the target holder 190 may be biased electrically with respect to the arc chamber 100. For example, the target holder 190 may be made from a conductive material and be biased by an independent power supply (not shown) so as to be at a different voltage than the walls 101. This voltage may be more positive or more negative than the voltage applied to the walls 101. In this way, electrical biasing may be used to sputter the sputter target 500.

In certain embodiments, the target holder 190 is in communication with one end of an actuator 200. The opposite end of the actuator 200 may be in communication with a support 210. In certain embodiments, this support 210 may be the housing of the IHC ion source 10. In certain embodiments, the actuator 200 may be able to change its total displacement. For example, the actuator 200 may be a telescoping design.

As noted above, in certain embodiments, the source gas may be an etching gas. This may be advantageous if the temperature of the sputter target 500 is such that the pressure in the arc chamber 100 is above the vapor pressure of the metal material. In this case, the etching gas is used to etch atoms or molecules of the metal material. In certain embodiments, it may be desirable for the porous carrier to be etched at the same rate or nearly the same rate as the metal material. In this way, the metal material continues to fill an entirety of the porous carrier, even as it is being etched away. In other words, in this embodiment, the metal material is not vaporized. Thus, in order to allow atoms of the metal material to be sputtered, an etching species, such as fluorine is used. The fluorine can be introduced as part of a fluorinated gas such as $BF_3$, $PF_3$, $NF_3$, $SiF_4$, $CF_4$, or $GeF_4$ for example. As the fluorine attacks the metal material, the volume of the metal material decreases. More specifically, the metal material that is exposed to the outside environment is removed. If the porous carrier is etched at a similar rate, then the metal material remains near the outer edges of the porous carrier.

Thus, in this embodiment, the etching gas is used to etch the metal material to create the dopant species of interest, and the porous carrier is etched so that the metal material in the sputter target remains accessible to the etching gas.

In other embodiments, the temperature of the sputter target 500 may be such that the pressure within the arc chamber 100 is less than the vapor pressure of the metal material. In this embodiment, the metal material becomes a gas as it exits the porous carrier. In this embodiment, the source gas may be an etching gas or a carrier gas, such as argon. If the metal material becomes a gas, then the metal material can escape the porous carrier. In this case, the porous carrier may not be etched.

Figure 6:
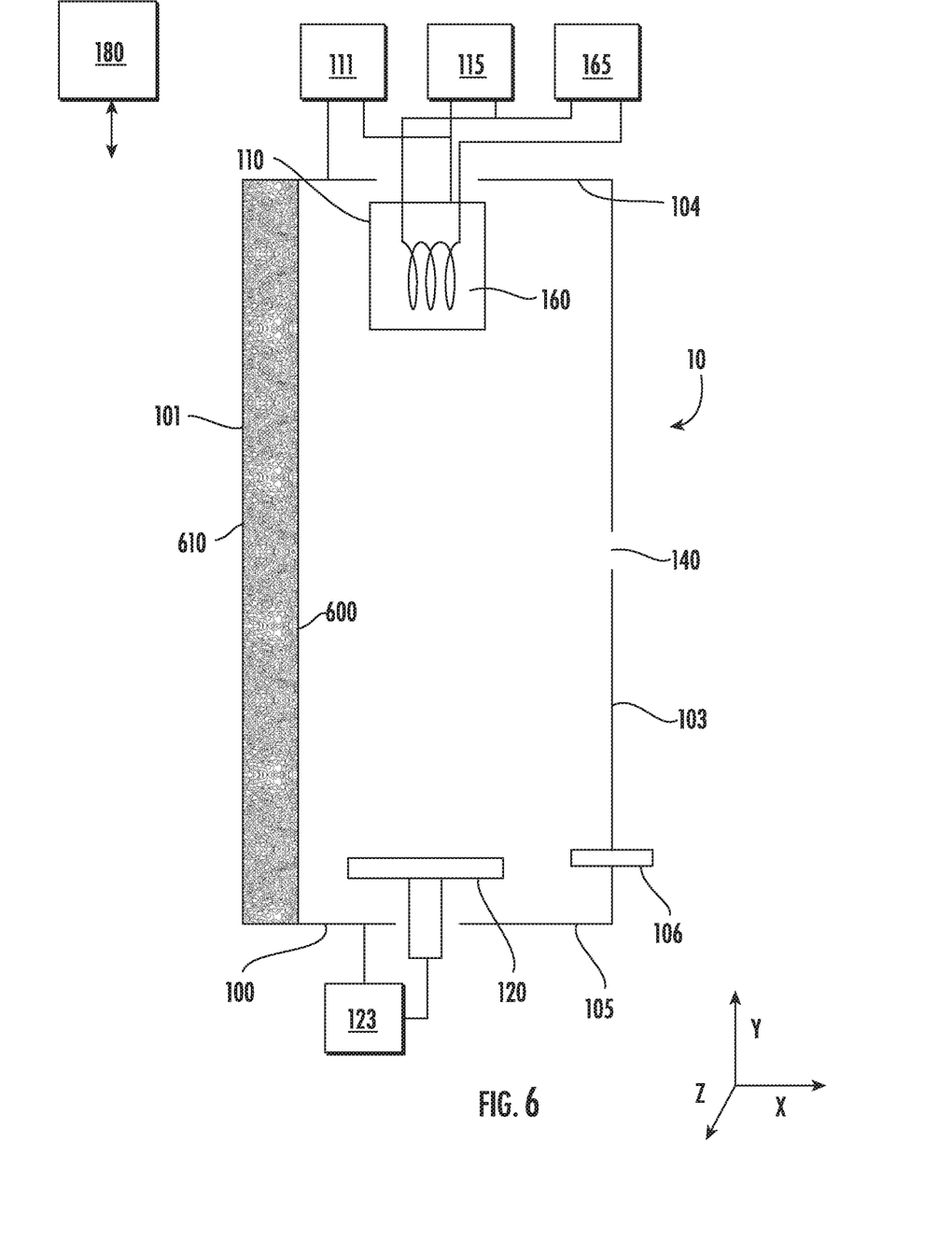
FIG. 6 is an indirectly heated cathode (IHC) ion source that may utilize the sputter target according to another embodiment.

FIG. 6 shows a second embodiment of an IHC ion source 10 that may be used with the sputter target 600. In this embodiment, the target holder is not used. Rather, a liner 610 may be disposed along at least one wall 101 of the arc chamber 100. This liner 610 may serve as the sputter target 600. In other words, the liner 610 may be a porous carrier that is filled with the metal material.

Figure 7:
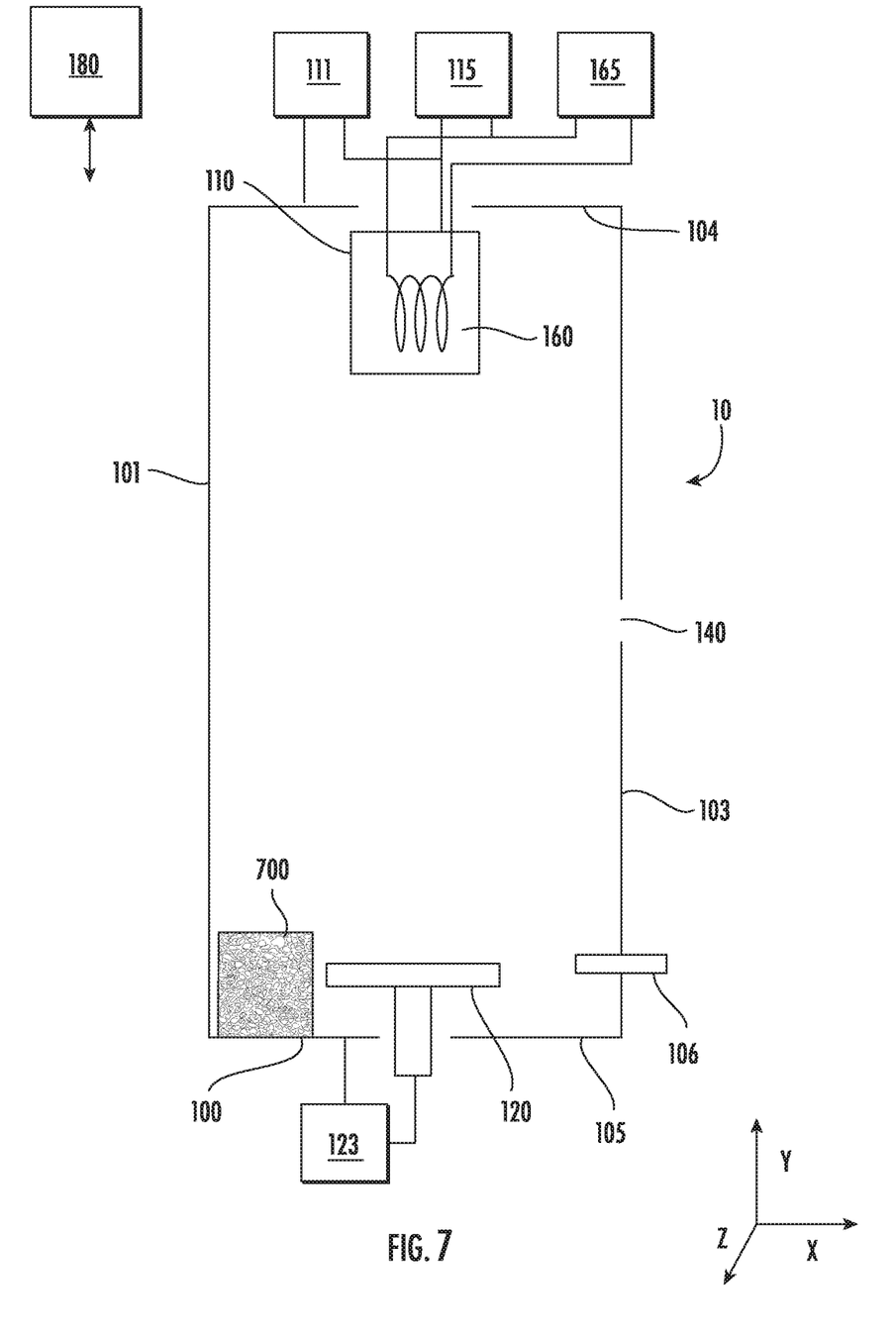
FIG. 7 is an indirectly heated cathode (IHC) ion source that may utilize the sputter target according to a third embodiment.

FIG. 7 shows a third embodiment of the IHC ion source 10 that may be used with the sputter target 700. In this embodiment, the sputter target 700 is simply disposed along one wall 101 of the arc chamber 100. For example, the sputter target may rest on the wall 101 of the arc chamber 100 that is parallel to the horizon. In another embodiment, a repeller 120 may not be used and the sputter target 700 may be disposed in the location occupied by the repeller 120. The selection of the wall on which the sputter target 700 is disposed is based on the orientation of the IHC ion source 10.

Figure 8:
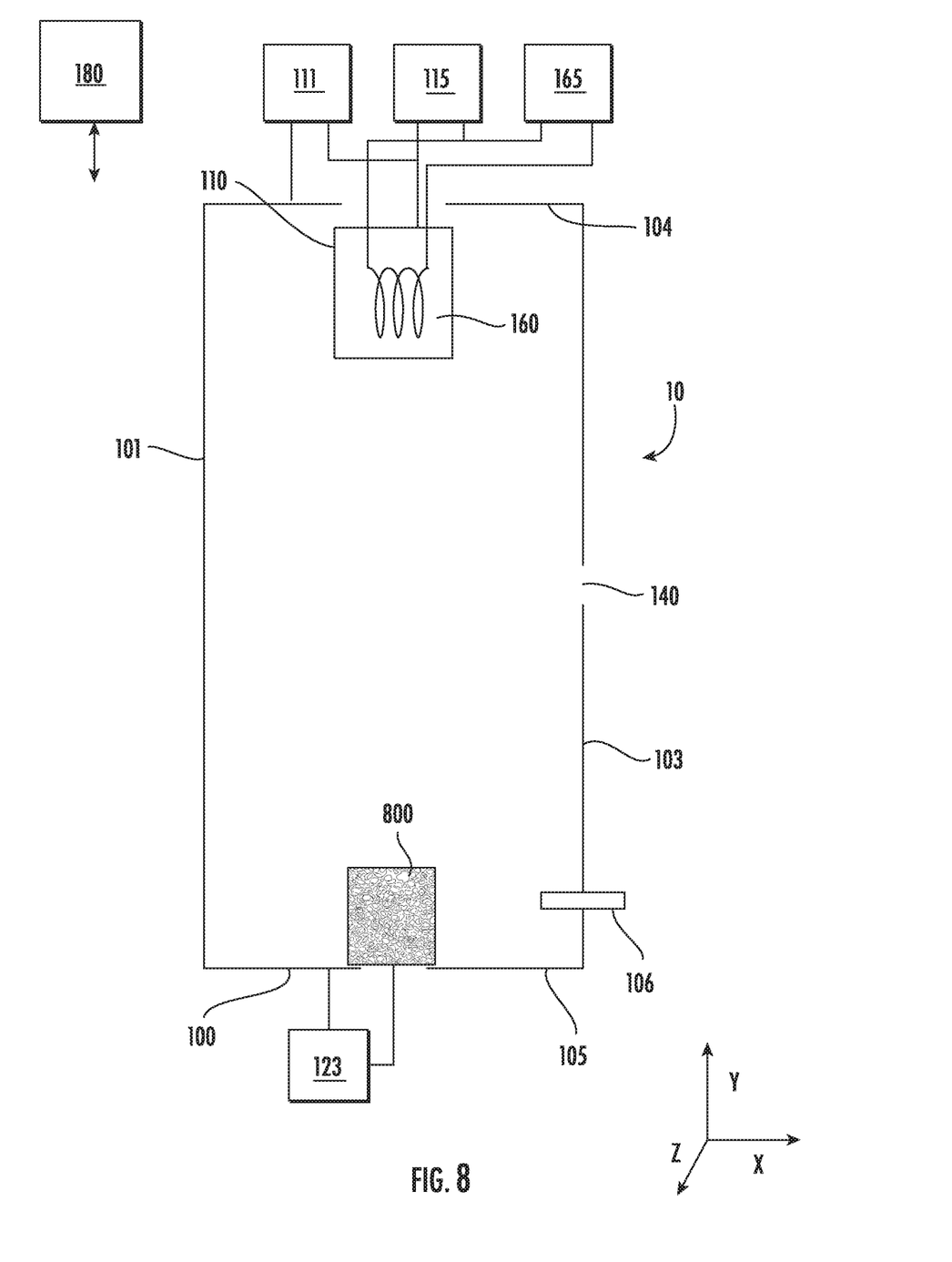
FIG. 8 is an indirectly heated cathode (IHC) ion source that may utilize the sputter target according to another embodiment.

In one particular embodiment, shown in FIG. 8, the sputter target 800 may function as the repeller. The repeller bias power supply 123 may be in communication with the sputter target 800 directly. In another embodiment, the sputter target 800 may be disposed on a conductive platform which is electrically connected to the repeller bias power supply 123.

In FIGS. 5-8, an IHC ion source 10 is shown. However, the disclosure is not limited to this embodiment. For example, an ion source that utilizes a Bernas source, a capacitively coupled plasma generator, or an inductively coupled plasma generator may also employ the sputter target described herein.

Figure 9:
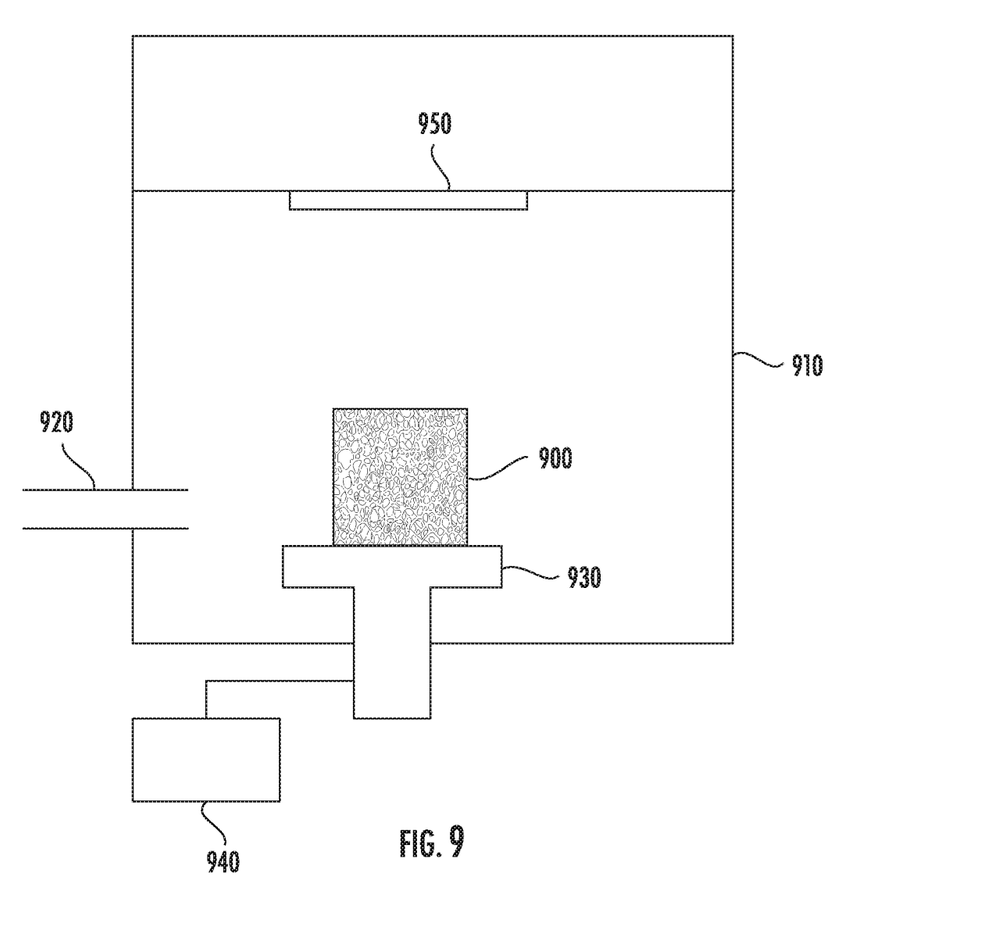
FIG. 9 is a physical vapor deposition (PVD) chamber that may utilize the sputter target according to one embodiment.

Further, the sputter target may be used in other applications. For example, as shown in FIG. 9, the sputter target 900 may be disposed within a physical vapor deposition (PVD) chamber 910. A gas inlet 920 supplies a working gas, such as argon, to the PVD chamber 910. The sputter target 900 may be disposed on a cathode 930, or may be otherwise in communication with a cathode power supply 940. The cathode power supply 940 serves to bias the sputter target 900 relative to the rest of the PVD chamber 910. The cathode power supply 940 may supply a DC voltage or an AC voltage, as desired. This causes the gas molecules in the PVD chamber 910 to be attracted toward the sputter target 900, causing it to sputter. Ions created from the sputter target 900 may be deposited on the substrate 950.

Note that this figure is purely illustrative, and other embodiments exist. For example, the cathode 930 and sputter target 900 may be disposed near the top of the PVD chamber 910, while the substrate 950 may be disposed near the lower surface.

The embodiments described above in the present application may have many advantages. First, the present system allows a solid metal material to be used as a dopant material without the issues associated with the prior art. Second, by utilizing a porous carrier, the metal material can be contained so as to prevent dripping and spilling. In this way, the ion source is not contaminated or damaged by the liquid form of the metal material. Third, the concentration of the metal material in the ion beam may be much greater using this sputter target as compared to conventional ceramic sputter targets. In one experiment, the concentration of aluminum in the ion beam more than doubled as compared to the ion beam produced using an alumina sputter target.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source for generating an ion beam comprising a metal material, comprising:
   an arc chamber having a first end, an opposite second end and walls connecting the first end and the second end, wherein one of the walls comprises an extraction aperture;
   a cathode disposed at the first end; and
   a sputter target disposed within the arc chamber, the sputter target comprising a porous carrier, and a metal material disposed within the porous carrier.

2. The ion source of claim 1, wherein the sputter target is disposed against the second end.

3. The ion source of claim 2, wherein the sputter target functions as a repeller.

4. The ion source of claim 1, wherein the sputter target is disposed against one of the walls.

5. The ion source of claim 1, wherein the sputter target serves as a liner and is disposed against at least one of the walls.

6. The ion source of claim 1, further comprising a target holder, wherein the sputter target is retained by the target holder.

7. The ion source of claim 1, wherein the porous carrier comprises an open cell foam, a weave of strands or stacked meshes.

8. A physical vapor deposition apparatus, comprising:
   a physical vapor deposition (PVD) chamber;
   a cathode disposed in the PVD chamber, wherein the cathode is biased using a cathode power supply; and
   a sputter target disposed within the PVD chamber, the sputter target comprising a porous carrier, and a metal material disposed within the porous carrier, and in communication with the cathode power supply.

9. The physical vapor deposition apparatus of claim 8, wherein the porous carrier comprises an open cell foam, a weave of strands or stacked meshes.

* * * * *